(12) United States Patent
Choi

(10) Patent No.: US 11,817,842 B2
(45) Date of Patent: Nov. 14, 2023

(54) FILTER CIRCUIT FOR PREVENTING REVERSE INFLOW OF ELECTROMAGNETIC WAVES

(71) Applicant: HYUNDAI MOBIS Co., Ltd., Seoul (KR)

(72) Inventor: Jae Won Choi, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/534,859

(22) Filed: Nov. 24, 2021

(65) Prior Publication Data

US 2022/0166399 A1 May 26, 2022

(30) Foreign Application Priority Data

Nov. 25, 2020 (KR) .................. 10-2020-0160543

(51) Int. Cl.
| | |
|---|---|
| *H03H 7/01* | (2006.01) |
| *B60L 50/60* | (2019.01) |
| *B60L 3/00* | (2019.01) |
| *H02M 1/44* | (2007.01) |
| *H02M 1/12* | (2006.01) |
| *H03H 7/09* | (2006.01) |

(52) U.S. Cl.
CPC .......... *H03H 7/0115* (2013.01); *B60L 3/0046* (2013.01); *B60L 50/60* (2019.02); *H02M 1/123* (2021.05); *H02M 1/126* (2013.01); *H02M 1/44* (2013.01); *B60L 2270/147* (2013.01); *H03H 7/09* (2013.01)

(58) Field of Classification Search
CPC ........ H02M 1/44; H02M 1/123; H02M 1/126; H03H 7/0115; H03H 7/427; H03H 7/09; B60L 2270/147; B60L 3/0046; B60L 3/0038
See application file for complete search history.

(56) References Cited

U.S. PATENT DOCUMENTS

| | | | | |
|---|---|---|---|---|
| 4,888,675 | A | * 12/1989 | Kumar ................. | H03H 7/0115 363/47 |
| 2015/0171817 | A1 | * 6/2015 | Sun ........................ | B60R 16/02 307/9.1 |
| 2020/0079233 | A1 | * 3/2020 | Kim ........................ | H03H 7/06 |
| 2020/0204058 | A1 | * 6/2020 | Lindenberger .......... | H02M 1/44 |

* cited by examiner

*Primary Examiner* — Ryan Johnson
(74) *Attorney, Agent, or Firm* — Morgan, Lewis & Bockius LLP

(57) ABSTRACT

According to the present disclosure, a filter for reducing electromagnetic noise discharged through a line connected to the positive terminal B(+) of the battery is designed, but there is a problem that noise is rather introduced through this filter. However, in the filter circuit of the present disclosure, noise reversely introduced through the filter may be blocked by arranging an inductor for the filter in an expected inflow path of noise.

7 Claims, 2 Drawing Sheets

FILTER CIRCUIT FOR PREVENTING REVERSE INFLOW OF ELECTROMAGNETIC WAVES

CROSS-REFERENCE TO RELATED APPLICATIONS

This application claims priority under 35 U.S.C. § 119 to Korean Patent Application No. 10-2020-0160543, filed on Nov. 25, 2020, the disclosure of which is incorporated herein by reference in its entirety.

TECHNICAL FIELD

The present disclosure relates to a filter circuit connected to a battery (e.g., a low voltage battery) in a vehicle.

BACKGROUND

Eco-friendly vehicles including so-called electric vehicles (EVs), hybrid electric vehicles (HEVs), plug-in hybrid electric vehicles (PHEVs), etc. are equipped with a converter converting a high voltage (e.g., 48 V) is into a low voltage (e.g., 12 V) and charging a low voltage battery with the converted low voltage. Such a converter is also called a low-voltage DC-DC converter (LDC).

The low voltage battery charged by the converter supplies power to an electric load in the vehicle. In this case, a CLC filter circuit for bypassing electromagnetic noise of a B(+) terminal of the low voltage battery is designed between the low voltage battery and the electric load.

However, a phenomenon in which noise is rather introduced through the CLC filter for bypassing electromagnetic noise occurs.

SUMMARY

Accordingly, the present disclosure provides a filter circuit for preventing reverse inflow of electromagnetic waves to prevent noise introduced through a filter used to bypass electromagnetic noise.

In one general aspect, a filter circuit for preventing reverse inflow of electromagnetic waves includes: a first capacitor including one side terminal connected to a positive terminal of a vehicle battery and the other side terminal connected to a negative terminal of the vehicle battery; a second capacitor connected to the first capacitor in parallel; a third capacitor connected between one side terminal of the second capacitor and a ground and a fourth capacitor connected to the third capacitor in parallel; a fifth capacitor connected between the other side terminal of the second capacitor and the ground and a sixth capacitor connected to the fifth capacitor in parallel; a transformer having an input terminal connected to the second capacitor; and a plurality of capacitors connected to an output terminal of the transformer in parallel; and a first inductor connected between the positive terminal of the vehicle battery and the one side terminal of the first capacitor, and a second inductor connected between the negative terminal of the vehicle battery and the other side terminal of the first capacitor.

In another general aspect, a filter circuit for preventing reverse inflow of electromagnetic waves includes: a first capacitor including one side terminal connected to a positive terminal of a vehicle battery and the other side terminal connected to a negative terminal of the vehicle battery; a second capacitor connected to the first capacitor in parallel; a third capacitor connected between one side terminal of the second capacitor and a ground and a fourth capacitor connected to the third capacitor in parallel; a fifth capacitor connected between the other side terminal of the second capacitor and the ground and a sixth capacitor connected to the fifth capacitor in parallel; a transformer having an input terminal connected to the second capacitor; a plurality of capacitors connected to an output terminal of the transformer in parallel; a first inductor connected between the positive terminal of the vehicle battery and the one side terminal of the first capacitor; a second inductor connected between the negative terminal of the vehicle battery and the other side terminal of the first capacitor; and a third inductor connected between the positive terminal of the vehicle battery and a voltage sensor.

Other features and aspects will be apparent from the following detailed description, the drawings, and the claims.

DETAILED DESCRIPTION OF EMBODIMENTS

Figure 1:
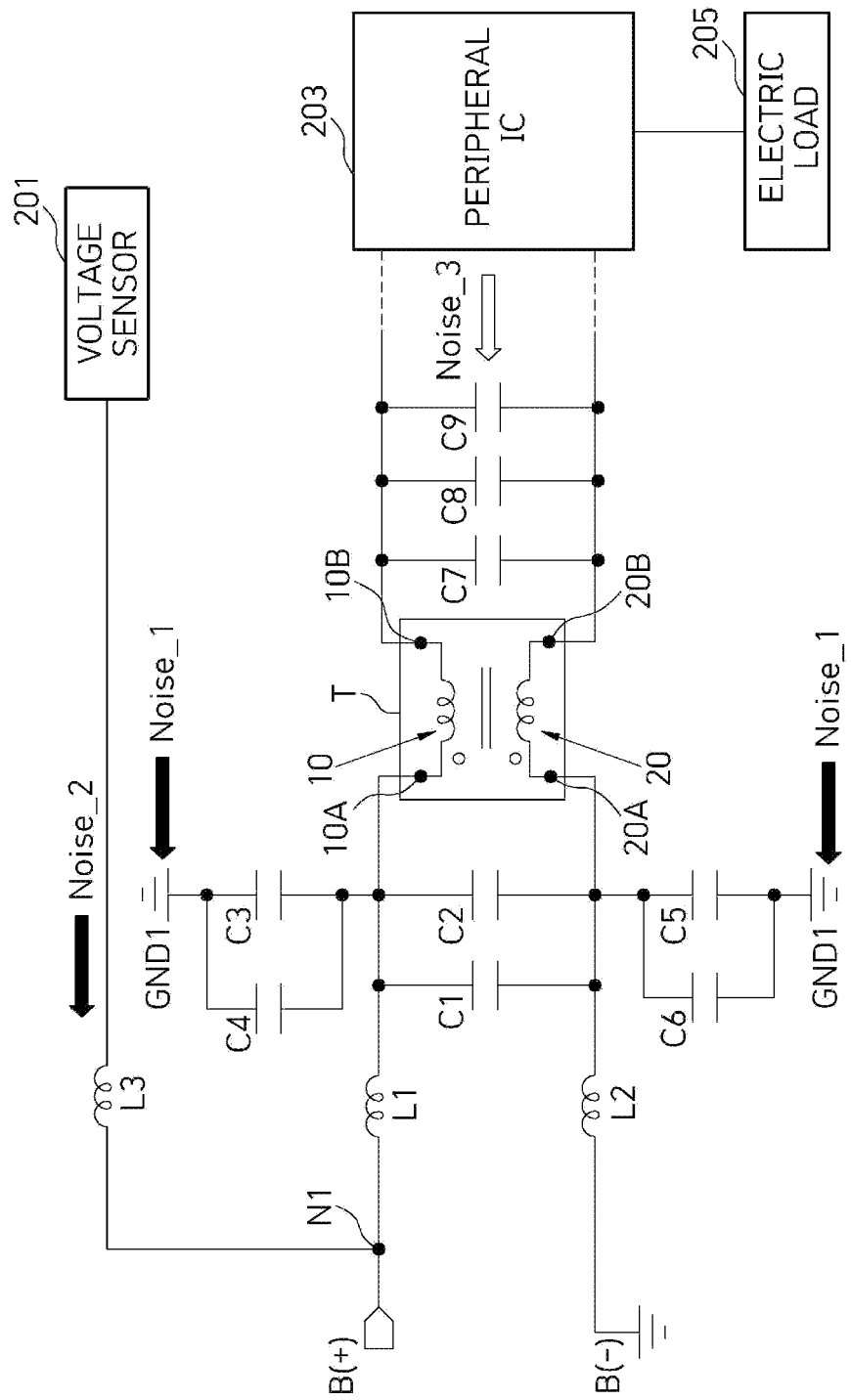
FIG. 1 is a circuit diagram illustrating a filter circuit for preventing reverse inflow of electromagnetic waves according to an embodiment of the present disclosure.

Hereinafter, embodiments of the present disclosure will be described in detail with reference to the accompanying drawings.

The advantages, features and aspects of the present disclosure will become apparent from the following description of the embodiments with reference to the accompanying drawings, which is set forth hereinafter. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Hereinafter, embodiments of the present disclosure will be described in detail with reference to the accompanying drawings.

Hereinafter, exemplary embodiments of the present disclosure will be described in detail with reference to the accompanying drawings. In adding reference numerals for elements in each figure, it should be noted that like reference numerals already used to denote like elements in other figures are used for elements wherever possible. Moreover, detailed descriptions related to well-known functions or configurations will be ruled out in order not to unnecessarily obscure subject matters of the present disclosure.

FIG. 1 is a circuit diagram illustrating a filter circuit for preventing reverse inflow of electromagnetic waves according to an embodiment of the present disclosure.

Referring to FIG. 1, a filter circuit for preventing reverse inflow of electromagnetic waves according to an embodiment of the present disclosure may be designed between a battery in a vehicle and a peripheral IC 203.

The battery in the vehicle may be a low voltage battery. The low voltage battery may be, for example, a 12V battery.

The peripheral IC 203 may be a peripheral circuit component for supplying a voltage of the battery filtered by the filter circuit according to an embodiment of the present disclosure to an electric load 205.

The filter circuit according to an embodiment of the present disclosure may have a CLC filter structure, and the filter circuit having such a CLC filter structure is connected to a positive terminal B(+) and a negative terminal B(−) of the battery.

In the filter circuit having the CLC filter structure, first to third noises Noise_1, Noise_2, and Noise_3 may be reversely introduced through three expected inflow paths, respectively.

The first noise Noise_1 may be noise reversely introduced through a ground GND1 connected to the filter circuit according to an embodiment of the present disclosure.

The second noise Noise_2 may be noise introduced through a path connecting node N1 to a voltage sensor 201, which is a path branched from a node N1 directly connected to the positive terminal B(+) of the battery. Here, the voltage sensor 201 may be a sensor that measures a voltage of the positive terminal B(+) of the battery. That is, the second noise Noise_2 may be noise (sensing noise) inversely introduced from the voltage sensor 201.

The third noise Noise_2 may be noise reversely introduced from the peripheral IC 203.

In order to block reverse inflow of the first to third noises Noise_1, Noise_2, and Noise_3, the filter circuit according to an embodiment of the present disclosure includes first to third filter elements (L1, L2, L3) designed in an inflow path of each noise.

Each of the first to third filter elements L1, L2, and L3 may be implemented as, for example, an inductor (or an inductor for a filter).

In this disclosure, the first to third filter elements L1, L2, and L3 are referred to as first to third inductors L1, L2, and L3, respectively, and the same reference symbols are used.

Hereinafter, the filter circuit designed to include the first to third filter elements L1, L2, and L3 designed in the reverse inflow path of the first to third noises Noise_1, Noise_2, and Noise_3 will be described in detail.

The positive terminal B(+) of the battery is connected to one side terminal of the first inductor L1 through the node N1, and a negative terminal B(1) of the battery is connected to one side terminal of the second inductor L2.

In addition, the positive terminal B(+) of the battery is connected to the voltage sensor 201 through a line branched from the node N1. In this case, a third inductor L3 connecting the node N1 to the voltage sensor 201 is designed on a line branched from the node N1. Accordingly, the voltage sensor 201 is connected to the positive terminal B(+) of the battery through the third inductor L3 to measure a voltage of the positive terminal B(+). At the same time, reverse inflow of the second noise Noise_2 from the voltage sensor 201 may be blocked by the third inductor L3.

The other side terminal of the first inductor L1 is commonly connected to one side terminal of the first capacitor C1 and one side terminal of the second capacitor C2, and the other side terminal of the second inductor L2 is commonly connected to the other side terminal of the first capacitor C1 and the other side terminal of the second capacitor C2.

The second capacitor C2 is connected to the first capacitor C1 in parallel.

One side terminal of the second capacitor C2 is connected to one side terminal of the third capacitor C3, and the other side terminal of the third capacitor C3 is connected to the ground GND1 through which the first noise Noise_1 may be introduced. That is, one side terminal of the second capacitor C2 is connected to the ground GND1 by the third capacitor C3.

The fourth capacitor C4 is connected in parallel with the third capacitor C3.

The other side terminal of the second capacitor C2 is connected to one side terminal of the fifth capacitor C5, and the other side terminal of the fifth capacitor C5 is connected to the ground GND1 through which the first noise Noise_1 may be introduced. That is, the other side terminal of the second capacitor C2 is connected to the ground GND1 by the fifth capacitor C5.

A connection structure of the first to sixth capacitors C1 to C6 forms a path through which first noise Noise_1 may be reversely introduced through the ground GND1, but the first noise Noise_1 may be prevented from being reversely introduced to the positive terminal B+ and the negative terminal B− of the battery through the ground GND1 by a first inductor L1 commonly connected to one side terminal of the first capacitor and one side terminal of the second capacitor C2 and a second inductor L2 commonly connected to the other side terminal of the first capacitor C1 and the other side terminal of the second capacitor C2.

The second capacitor C2 is connected to a transformer T.

Specifically, one side terminal of the second capacitor C2 is connected to one end 10A of a first coil 10 of the transformer T, and the other side terminal of the second capacitor C2 is connected to one end 20A of the second coil 20 of the transformer T. Here, one end 10A of the first coil 10 and one end 20A of the second coil 20 may be referred to as an 'input terminal' of the transformer T.

The other end 10B of the first coil 10 of the transformer T and the other end 20B of the second coil 20 of the transformer T are respectively connected to both ends of a seventh capacitor C7. Here, the other end 10B of the first coil 10 and the other end 20B of the second coil 20 may be referred to as an 'output terminal' of the transformer T.

In addition, eighth and ninth capacitors C8 and C9 are connected in parallel to the seventh capacitor C7, and a ninth capacitor C9 is connected to the peripheral IC 203.

As such, a connection structure of the first capacitor C1, the second capacitor C2, the transformer T, the seventh capacitor C7, the eighth capacitor C8, the ninth capacitor C9, and the peripheral IC 203 forms a path through which the third noise Noise_3 is reversely introduced from the peripheral IC 203, but the third noise Noise_3 may be blocked from being inversely introduced toward the positive terminal B(+) and the negative terminal B(−) of the battery by the first and second inductors L1 and L2 connected to both ends of the first and second capacitors C1 and C2.

Figure 2:
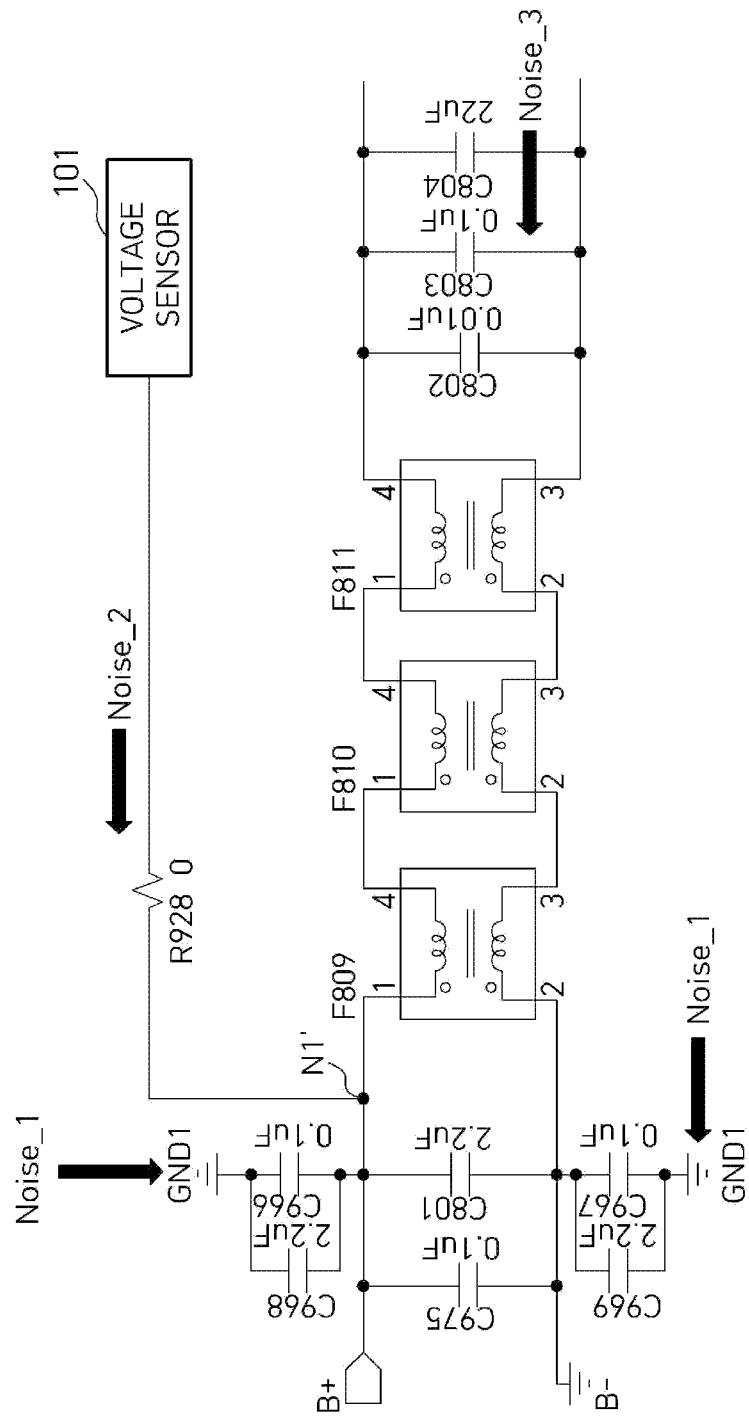
FIG. 2 is a circuit diagram showing a filter circuit of the related art comparable to a filter circuit of the present disclosure.

FIG. 2 is a circuit diagram showing a filter circuit of the related art comparable to a filter circuit according to an embodiment of the present disclosure.

Referring to FIG. 2, when comparing the filter circuit of the related art with the filter circuit according to the embodiment of the present disclosure, there are the following differences.

First, in the filter circuit of the related art, only a resistor R928 is present in a line connected to the voltage sensor 101, and the inductor L3 does not exist as in the present disclosure. Therefore, the filter circuit of the related art cannot block the second noise Noise_2 reversely introduced from the voltage sensor 101.

Second, in the filter circuit of the related art, a node N1' connecting the voltage sensor 101 to the filter circuit of the related art is present in a line connecting one end of a capacitor C801 (which corresponds to C2 of the present disclosure) and one end 1 of a first coil of a first transformer F809, but the node N1 connecting the voltage sensor 101 to the filter circuit of the present disclosure is present in the line between the first capacitor C1 and the positive terminal B+ of the battery. That is, in the present disclosure, the voltage sensor 101 is directly connected to the positive terminal B(+) of the battery to more accurately measure a voltage of the positive terminal B(+) of the battery. In this manner, the design of the third inductor L3 serves to move the node N1 connecting the voltage sensor 101 to the filter circuit of the present disclosure to a front stage of the first capacitor C1 to more accurately measure a voltage of the positive terminal B(+) of the battery.

Third, the filter circuit of the related art is designed to have a filter function by including three transformers F809, F810, and F811 connected in series, but in the present disclosure, only one transformer T is designed to have a filter function. This is possible because the first and second inductors respectively connected to the positive terminal B(+) and negative terminal B(−) of the battery are designed.

That is, the filter circuit of the related art has an effect of blocking noise from the peripheral IC 203 by the design of the three transformers F809, F810, and F811 connected in series, but has a problem in that the number of transformers increases as many to increase a part size. In contrast, in the present disclosure, by designing the first and second inductors L1 and L2 at both ends of the first capacitor C1, even if one transformer is used, reverse inflow of the third noise from the peripheral IC 203 may be blocked, and, at the same time, the part size and manufacturing cost may be reduced.

Fourth, in the filter circuit of the related art, it is impossible to block the first noise Noise_1 reversely flowing through the ground GND1, but in the present disclosure, the first noise Noise_1 reversely flowing through the ground GND1 may be blocked by designing the first and second inductors L1 at both ends of the first capacitor C1.

As described above, in the filter circuit for preventing reverse inflow of electromagnetic waves according to the present disclosure, the input terminal connected to the battery is designed to include the first to third inductors L1, L2, and L3, thereby blocking reverse inflow of the first to third noise Noise_1, Noise_2, and Noise_3 and reducing the number of components such as a transformer to reduce an overall size and manufacturing cost.

In addition, as the voltage sensor 201 may be directly connected to the positive terminal B(+) of the battery by the third inductor L3, a voltage of the positive terminal B(+) of the battery may be more accurately measured.

So far, the present disclosure has been described in detail through embodiments of the present disclosure, but a person skilled in the art to which the present disclosure pertains will appreciate that the present disclosure may be implemented in a specific form different from the contents without changing technical spirit or essential features thereof.

For example, when it is not necessary to measure the voltage of the positive terminal B(+) of the battery, the third inductor L3 disposed between the filter circuit of the present disclosure and the voltage sensor 201 may be deleted. In this case, the number of components and manufacturing cost may be further reduced.

According to the present disclosure, a filter for reducing electromagnetic noise discharged through a line connected to the positive terminal B(+) of the battery is designed, but there is a problem that noise is rather introduced through this filter.

However, in the filter circuit of the present disclosure, noise reversely introduced through the filter may be blocked by arranging an inductor for the filter in an expected inflow path of noise.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A filter circuit for preventing reverse inflow of electromagnetic waves, the filter circuit comprising:
   a first capacitor including one side terminal connected to a positive terminal of a vehicle battery and the other side terminal connected to a negative terminal of the vehicle battery;
   a second capacitor connected to the first capacitor in parallel;
   a third capacitor connected between one side terminal of the second capacitor and a ground, and a fourth capacitor connected to the third capacitor in parallel;
   a fifth capacitor connected between the other side terminal of the second capacitor and the ground, and a sixth capacitor connected to the fifth capacitor in parallel;
   a transformer having an input terminal connected to the second capacitor; and
   a plurality of capacitors connected to an output terminal of the transformer in parallel
   a first inductor connected between the positive terminal of the vehicle battery and the one side terminal of the first capacitor;
   a second inductor connected between the negative terminal of the vehicle battery and the other side terminal of the first capacitor; and
   a third inductor connected between the positive terminal of the vehicle battery and a voltage sensor.

2. The filter circuit of claim 1, wherein the third inductor is configured to cut off noise reversely introduced through the voltage sensor.

3. The filter circuit of claim 1, wherein the first and second inductors are configured to block noise reversely introduced from a peripheral circuit connected to the plurality of capacitors.

4. The filter circuit of claim 1, wherein the first and second inductors are configured to block noise reversely introduced through the ground.

5. The filter circuit of claim 1, wherein the voltage sensor is connected to the positive terminal of the vehicle battery directly through the third inductor to measure a voltage of the positive terminal.

6. The filter circuit of claim 1, wherein the vehicle battery is a battery installed in an eco-friendly vehicle and a low-voltage battery charging a low voltage converted from a high voltage by a converter.

7. The filter circuit of claim 1, wherein the plurality of capacitors connected to the output terminal of the transformer in parallel include seventh to ninth capacitors.

* * * * *